(12) United States Patent
Liaw et al.

(10) Patent No.: US 8,315,084 B2
(45) Date of Patent: Nov. 20, 2012

(54) FULLY BALANCED DUAL-PORT MEMORY CELL

(75) Inventors: Jhon Jhy Liaw, Zhudong Township, Hsinchu County (TW); Chih-Hung Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 335 days.

(21) Appl. No.: 12/721,476

(22) Filed: Mar. 10, 2010

(65) Prior Publication Data

US 2011/0222332 A1 Sep. 15, 2011

(51) Int. Cl.
*G11C 11/00* (2006.01)
(52) U.S. Cl. ............... 365/154; 365/156; 365/189.11
(58) Field of Classification Search .......... 365/154, 365/156, 189.11, 230.06
See application file for complete search history.

(56) References Cited

U.S. PATENT DOCUMENTS

| | | | |
|---|---|---|---|
| 5,289,432 A | 2/1994 | Dhong et al. | |
| 6,084,820 A | 7/2000 | Raszka | |
| 6,091,626 A | 7/2000 | Madan | |
| 6,181,634 B1 | 1/2001 | Okita | |
| 6,535,453 B2 * | 3/2003 | Nii et al. | 365/230.05 |
| 7,002,258 B2 | 2/2006 | Mali et al. | |
| 7,580,317 B2 * | 8/2009 | Kato | 365/230.05 |
| 7,605,447 B2 * | 10/2009 | Doris et al. | 257/618 |
| 2005/0247981 A1 | 11/2005 | Wang | |
| 2005/0253287 A1 | 11/2005 | Liaw | |
| 2007/0025132 A1 | 2/2007 | Liaw | |
| 2007/0090428 A1 | 4/2007 | Liaw | |
| 2008/0019171 A1 | 1/2008 | Liaw | |

OTHER PUBLICATIONS

Application for related matter U.S. Appl. No. 12/827406, filed Jun. 30, 2010, 32 pages.
Application for related matter U.S. Appl. No. 12/832907, filed Jun. 25, 2010, 46 pages.
Application for related matter U.S. Appl. No. 12/827690, filed Jun. 30, 2010, 36 pages.
Application for related matter U.S. Appl. No. 12/823860, filed Jun. 25, 2010, 38 pages.
Koji Nii et al., "A 90nm Dual-Port SRAM with 2.04 $\mu m^2$ 8T-Thin Cell Using Dynamically-Controlled Column Bias Scheme", 2004 IEEE International Solid-State Circuits Conference, 0-7803-8267-6/04, 10 pages.

* cited by examiner

*Primary Examiner* — David Lam
(74) *Attorney, Agent, or Firm* — Haynes and Boone, LLP

(57) ABSTRACT

The present disclosure provides a dual port static random access memory (SRAM) cell. The dual-port SRAM cell includes four sets of cascaded n-type metal-oxide-semiconductor field-effect transistors (NMOSFETs), each set of cascaded NMOSFETs having a pull-down device and a pass-gate device; and a first and second pull-up devices (PU1 and PU2) configured with the four pull-down devices to form two cross-coupled inverters, wherein two of the pass-gate devices are configured to form a first port and another two of the pass-gate devices are configured to form a second port.

22 Claims, 13 Drawing Sheets

FULLY BALANCED DUAL-PORT MEMORY CELL

BACKGROUND

In deep sub-micron integrated circuit technology, an embedded static random access memory (SRAM) device has become a popular storage unit of high speed communication, image processing and system-on-chip (SOC) products. For example, a dual port (DP) SRAM device allows parallel operation, such as 1R (read) 1W (write), or 2R (read) in one cycle, and therefore has higher bandwidth than a single port SRAM. In advanced technologies, low loading and high speed of the cell structure are important factors in embedded memory and SOC products. The thin style SRAM cell structure with short bit-line (BL) provides better performance on BL RC delay. However, the thin style cell structure suffers some problems including data node leakage, devices matching of pull-down (PD)/pass-gate (PG) devices and current crowding, etc. Special operation mode (parallel operation) of the DP SRAM requests more pull down drive capability to cover two-ports of the ON operation mode. This further requires double beta ratio setting for static noise margin (SNM). As such, the PD device width will be around 2× from the single-port cell. To consider reasonable SNM, the device width ratio between PD and PG is around 2~4 on the DP cell. This results in a L-shape or T-shape layout of the drain node of the PD device, and therefore may suffer the above problems. Another issue associated with the above structure is that one of half node uses the gate layer as intra-cell local interconnect to handle a current path between the source node of a PG transistor to the drain node of a PD transistor. This high resistance will dramatically impact the cell performance (such as cell current balance, read speed and write capability) when the gate layer resistance continuously increases from generation to generation.

SUMMARY

The present disclosure provides one embodiment of a dual port static random access memory (SRAM) cell. The dual-port SRAM cell includes four sets of cascaded metal-oxide-semiconductor field-effect transistors (MOSFETs), each set of cascaded MOSFETs having a pull-down device and a pass-gate device; and a first and second pull-up devices (PU1 and PU2) configured with the four pull-down devices to form two cross-coupled inverters, wherein two of the pass-gate devices are configured to form a first port and another two of the pass-gate devices are configured to form a second port.

The present disclosure also provides another embodiment of a dual port SRAM cell. The cell includes a first inverter having a first pull-up transistor and a first group of at least two pull-down transistors; a second inverter having a second pull-up transistors and a second group of at least two pull-down transistors, the second inverter is cross-coupled with the first inverter; a first group of at least two pass-gate transistors coupled with the first and second inverters to form a first port; and a second group of at least two pass-gate transistors coupled with the first and second inverters to form a second port, wherein each of the pull-down transistors and the pass-gate transistors includes a n-type metal-oxide-semiconductor field-effect transistor (NMOSFET) and each of the pull-up transistors includes a p-type metal-oxide-semiconductor field-effect transistor (PMOSFET).

The present disclosure also provides another embodiment of a dual port SRAM cell. The cell includes a first, second, third and fourth active regions formed in a substrate; a first pull-down transistor and a first pass-gate transistor formed in the first active region; a second pull-down transistor and a second pass-gate transistor formed in the second active region; a third pull-down transistor and a third pass-gate transistor formed in the third active region; a fourth pull-down transistor and a fourth pass-gate transistor formed in the fourth active region; a first pull-up transistor, and the first and second pull-down transistors configured to form a first inverter; and a second pull-up transistor, and the third and fourth pull-down transistors configured to form a second inverter. The second inverter is cross-coupled with the first inverter; the first and third pass-gate transistors coupled with the first and second inverters to form a first port; and the third and fourth pass-gate transistors coupled with the first and second inverters to form a second port.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Various drawings and associated text are provided in a Power Point file. Particularly.

DETAILED DESCRIPTION

Figure 1:
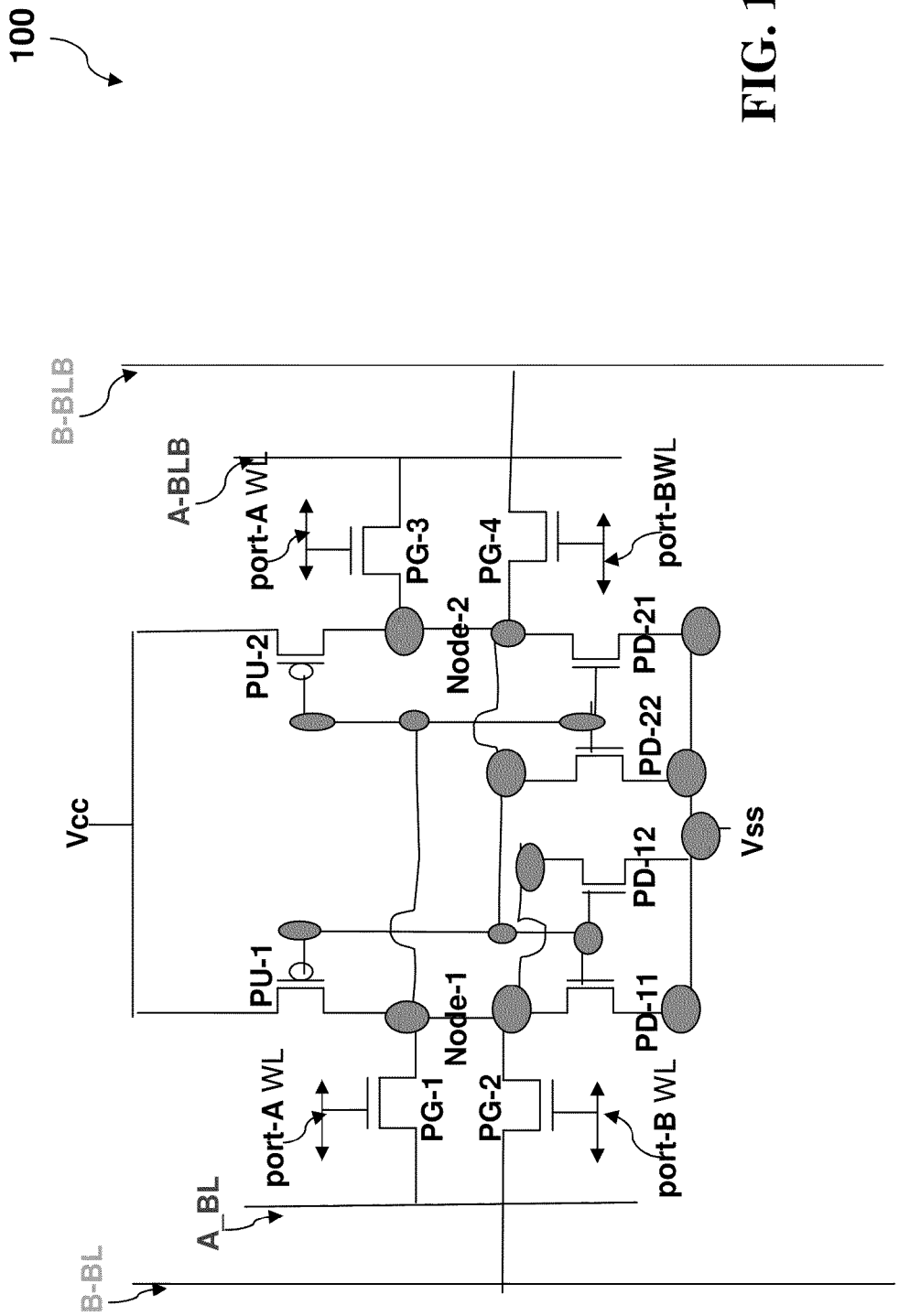
FIG. 1 is a schematic view of a dual port static random access memory (DP SRAM) device constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a schematic view of a dual-port (DP) SRAM cell 100 constructed according to various aspects of the present disclosure in one embodiment. The DP SRAM cell 100 includes a first and second inverters that are cross-coupled. The first inverter includes a first pull-up device formed by a p-type metal-oxide-semiconductor field-effect transistor (PMOSFET), referred to as PU-1, a first pull-down n-type MOSFET (NMOSFET), referred to as PD-11, and a second pull-down NMOSFET, referred to as PD-12. The second inverter includes a second pull-up device formed by a PMOSFET, referred to as PU-2, a third pull-down NMOSFET, referred to as PD-21, and a fourth pull-down NMOSFET, referred to as PD-22. The drain nodes (or drains) of PU-1, PD-11 and PD-12 are electrically connected together, defining a first data node (or first node). The drain nodes (or drains)

of PU-2, PD-21 and PD-22 are electrically connected together, defining a second data node (or second node or data node bar). The gate nodes (or gates) of PU-1, PD-11 and PD-12 are electrically connected and coupled to the second node. The gate nodes (or gates) of PU-2, PD-21 and PD-22 are electrically connected and coupled to the first node. The source nodes (or sources) of PU-1 and PU-2 are electrically connected to the power line (Vcc line). The source nodes (or sources) of PD-11, PD-12, PD-21 and PD-22 are electrically connected to a complementary power line (Vss line). In one embodiment of the DP SRAM cell layout, the sources of PD-11 and PD-12 are electrically connected to a first Vss line while the sources of PD-21 and PD-22 are electrically connected to a second Vss line.

The DP SRAM cell 100 further includes a first port (port-A) and a second port (port-B). In one embodiment, the port-A and port-B include at least pass-gate devices, referred to as PG-1, PG-2, PG-3 and PG-4, respectively. The pass-gate devices each includes a NMOSFET. The port-A includes a first pass-gate device (PG-1) and a third pass-gate device (PG-3). The port-B includes a second pass-gate device (PG-2) and a fourth pass-gate device (PG-4). The drain node (or drain) of PG-1 is electrically connected to a first bit-line (A_BL). The source node (or source) of PG-1 is electrically connected to the first node. The gate node (or gate) of PG-1 is electrically connected to a first word-line (referred to as port-A WL). The drain node of PG-2 is electrically connected to a second bit-line (B_BL). The source node of PG-2 is electrically connected to the first node. The gate node of PG-2 is electrically connected to a second word-line (referred to as port-B WL). The drain node of PG-3 is electrically connected to a first bit-line-bar (A_BLB). The source node of PG-3 is electrically connected to the second node. The gate node of PG-3 is electrically connected to the first word-line (port-A WL). The drain node of PG-4 is electrically connected to a second bit-line-bar (B_BLB). The source node of PG-4 is electrically connected to the second node. The gate node of PG-4 is electrically connected to the second word-line (port-B WL). Various NMOSFETs and PMOSFETs may be formed by any proper technology. In one embodiment, the various NMOSFETs and PMOSFETs are formed by conventional MOSFETs. In another embodiment, the various NMOSFETs and PMOSFETs are formed by Fin-like field effect transistors (FinFETs). In another embodiment, the various NMOSFETs and PMOSFETs are formed using high k/metal gate technology. The cell 100 may include additional devices such as additional pull-down devices and pass-gate devices. In one embodiment, the cell 100 includes more pull-down devices than pass-gate devices.

Figure 2:
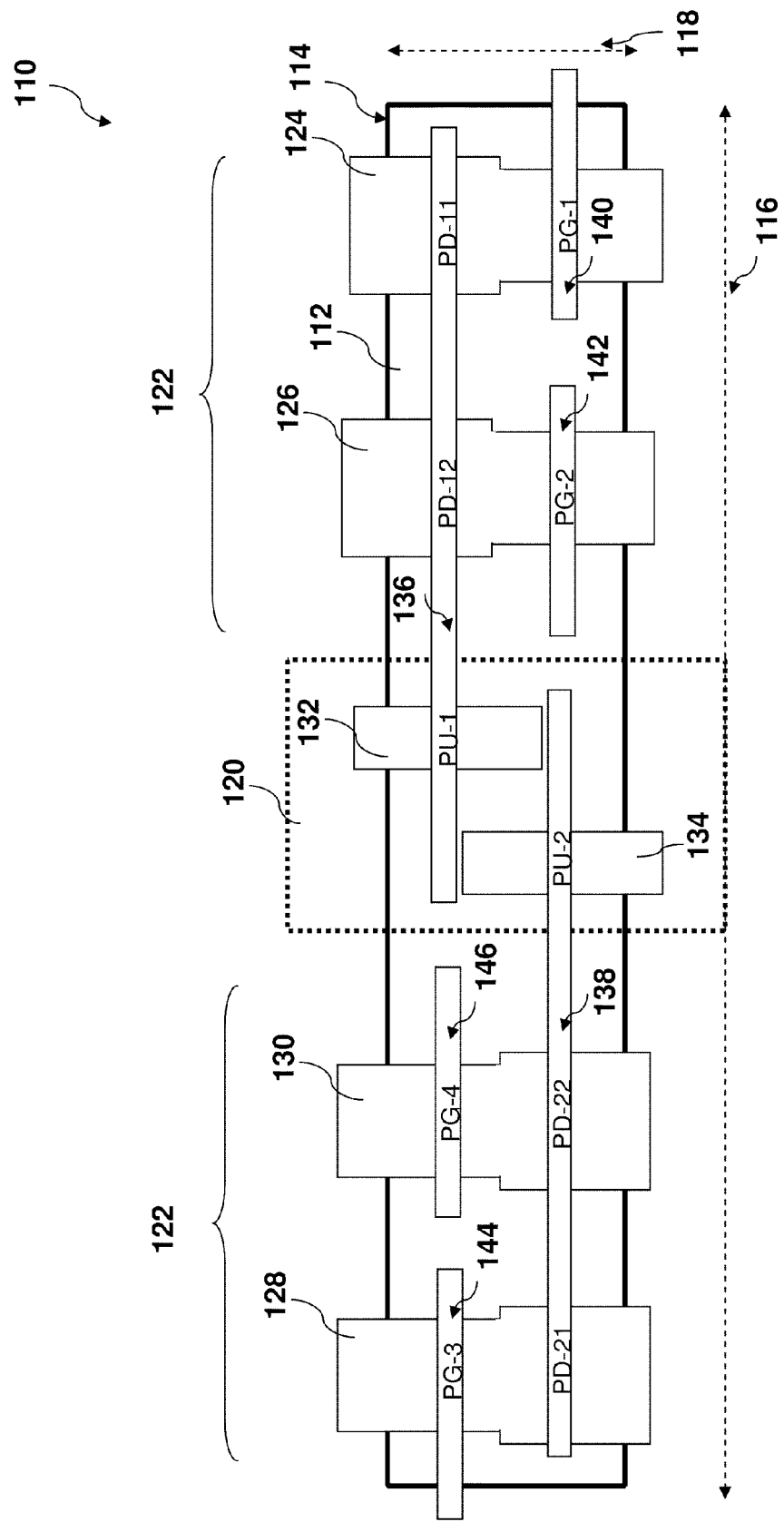
FIGS. 2 through 4 are top views of a DP SRAM device constructed according to various aspects of the present disclosure in one embodiment.

FIG. 2 is a top view of a DP SRAM cell 110 constructed according to various aspects of the present disclosure in one embodiment. In one embodiment, the DP SRAM cell 110 is a portion of the DP SRAM cell 100 in a particular configuration. The DP SRAM cell 110 includes one cell of DP SRAM and is formed on a semiconductor substrate. The DP SRAM cell 110 is formed in a unit cell region 112 of the semiconductor substrate. The unit cell region 112 is defined by the unit cell boundary 114. In one embodiment, the unit cell region 112 is defined in a rectangular shape spanning to a first dimension 116 in a first direction and spanning to a second dimension 118 in a second direction perpendicular to the first direction. The first dimension 116 is longer than the second dimension 118. So the first and second dimensions (116 and 118) are referred to as a longer pitch and a shorter pitch, respectively. The SRAM cell 110 includes a N-well region 120 disposed in the central portion of the cell. The SRAM cell 110 further includes a P-well region 122 disposed on the both sides of the N-well 120. In one embodiment, the N-Well 120 and P-well 122 are extended to multiple cells beyond the unit cell boundary. In one example, the N-well 120 and P-well 122 are extended to 4 or more cells in the second direction.

Various active regions are defined in the substrate by isolation features and are isolated from each other by the isolation features. The isolation features are formed in the substrate with a proper technology. In one embodiment, the isolation features are utilized by a shallow trench isolation (STI). In another embodiment, the isolation features are utilized by a local oxidation of silicon (LOCOS). In one embodiment, the DP SRAM cell 110 includes a first active region 124, a second active region 126, a third active region 128 and a fourth active region 130 formed in the P-well 122. The DP SRAM cell 110 further includes a fifth active region 132 and a sixth active region 134 formed in the N-well 120. The first through sixth active regions are disposed along the second dimension and may be extended to multiple cells. In one embodiment, the first through the sixth active regions are extended to 4 or more cells in the second direction. In one embodiment, each active region in the P-well includes a pull-down device and a pass-gate device formed thereon. In another embodiment, each active region in the P-well has varying width such that a portion for the pull-down device has a greater width than a portion for the pass-gate device. For example, the portion for the pull-down device has a width at least about 10% greater than the width of the portion for the pass-gate device.

In one embodiment, the first active region 124 includes the first pull-down device (PD-11) and the first pass-gate device (PG-1) that are cascaded. The source of PG-1 is electrically connected to the drain of the PD-11. Particularly, PD-11 is disposed in the wider portion of the first active region 124 while PG-1 is disposed in the narrower portion of the first active region 124. Similarly, the second active region 126 includes the second pull-down device (PD-12) and the second pass-gate device (PG-2) that are cascaded. The source of PG-2 is electrically connected to the drain of the PD-12. Particularly, PD-12 is disposed in the wider portion of the second active region 126 while PG-2 is disposed in the narrower portion of the second active region 126. The third active region 128 includes the third pull-down device (PD-21) and the third pass-gate device (PG-3) that are cascaded. The source of PG-3 is electrically connected to the drain of the PD-21. Particularly, PD-21 is disposed in the wider portion of the third active region 128 while PG-3 is disposed in the narrower portion of the third active region 128. The fourth active region 130 includes the fourth pull-down device (PD-22) and the fourth pass-gate device (PG-4) that are cascaded. The source of PG-4 is electrically connected to the drain of the PD-22. Particularly, PD-22 is disposed in the wider portion of the fourth active region 130 while PG-4 is disposed in the narrower portion of the fourth active region 130. The fifth active region 132 includes the first pull-up device (PU-1) and the sixth active region 134 includes the second pull-up device (PU-2).

Various gate features are formed within the DP SRAM cell 110 for various NMOSFETs and PMOSFETs. A gate feature includes a gate dielectric layer (such as silicon oxide) and a gate electrode (such as doped polysilicon) disposed on the gate dielectric layer. In another embodiment, the gate feature alternatively or additionally includes other proper materials for circuit performance and manufacturing integration. For example, the gate dielectric layer includes high k dielectric material layer. The gate electrode includes metal, such as aluminum, copper, tungsten or other proper conductive material. In one embodiment, the cell 110 includes a first gate feature 136 disposed in the cell region 112 and extended in the first direction over the first active region 124, the second active region 126, and the fifth active region 132, forming the gates for PD-11, PD-12 and PU-1. The cell 110 includes a second gate feature 138 disposed in the cell region 112 and extended in the first direction over the third active region 128, the fourth active region 130, and the sixth active region 134, forming the gates for PD-21, PD-22 and PU-2. The cell 110 includes various gate features for the pass-gate devices. In one embodiment, the cell 110 includes a gate feature 140 disposed over the first active region 124, forming the gate for PG-1. The cell 110 includes a gate feature 142 disposed over the second active region 126, forming the gate for PG-2. The cell 110 includes a gate feature 144 disposed over the third active region 128, forming the gate for PG-3. The cell 110 includes a gate feature 146 disposed over the fourth active region 130, forming the gate for PG-4.

Figure 3:
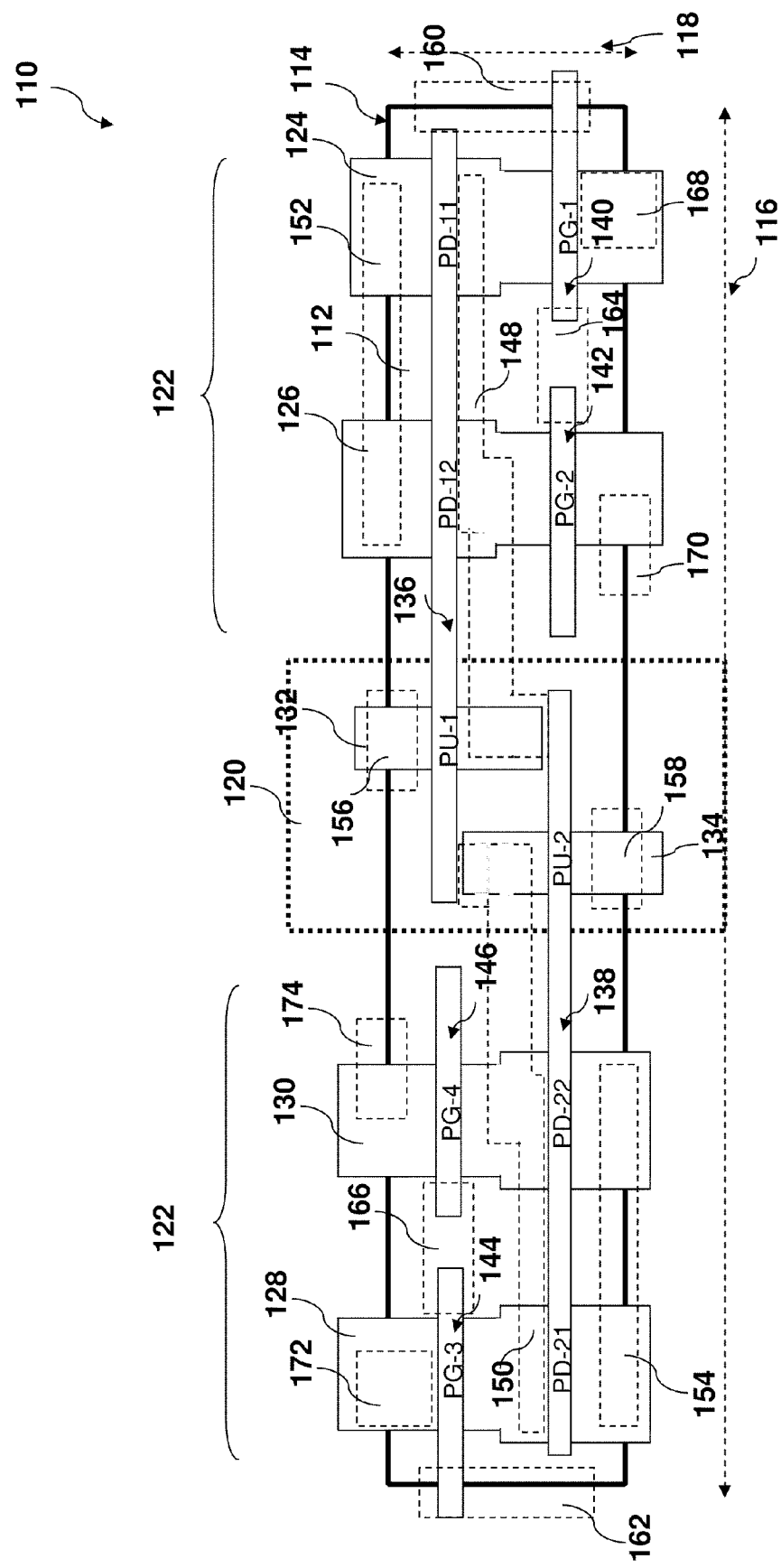

In one embodiment of the configuration as illustrated in FIG. 2, the first through the fourth active regions in the P-well 122 and the associated pull-down devices and pass-gate devices are symmetrically disposed on the two sides of the N-well 120 with symmetrical interconnect routing. With further reference to FIG. 3, illustrated is a top view of the DP SRAM cell 110 including interconnect routings. Various interconnect structures may be utilized to couple the NMOS-FETs and PMOSFETs to form the functional DP SRAM cell. In one embodiment, the drain of PD-11 is electrically connected to the source of PG-1 by sharing a common doped region, a region defined in the first active region 124 and positioned between the PD-11 and PG-1. In another embodiment, the drain of PD-11 is electrically connected to the source of PG-1 by a silicide feature (not shown) formed on the common doped region within the first active region 124. The silicide feature is formed by a process known in the art such as self-aligned silicide (salicide) and can be formed together with other contact silicide in a same processing procedure. Similarly, the drain of PD-12 and the source of PG-2 are electrically connected in a way similar to the connection between the drain of PD-11 and the source of PG-1, such as by a silicide feature. Likewise, the connection between the drain of PD-21 and PG-3, and the connection between the drain of PD-21 and PG-3 are formed similarly in terms of configuration and formation.

In one embodiment, the drains (drain node) of PD-11, PD-12 and PU-1 are electrically connected using an interconnect feature 148, defining a first data node (node 1 or data node). Similarly, the drains (drain node) of PD-21, PD-22 and PU-2 are electrically connected using an interconnect feature 150, defining a second data node (node 2 or data node bar). The first interconnect feature 148 and the second interconnect feature 150 are formed in a same interconnect layer (referred to as first interconnect layer or M1) by a same processing procedure.

In another embodiment, a first Vss connection 152 and a second Vss connection 154 are formed in the first interconnect layer. In another embodiment, various landing pads are formed in the first interconnect layer. Those landing pads include a first Vcc landing pad 156, a second Vcc landing pad 158, a first WL-A landing pad 160, a second WL-A landing pad 162, a first WL-B landing pad 164, a second WL-B landing pad 166, an A-BL landing pad 168, a B-BL landing pad 170, an A-BL bar landing pad 172, and a B-BL bar landing pad 174, as illustrated in FIG. 3. Each landing pad is designed and disposed for coupling a device feature to a respective circuit line through one or more contacts. Specifically, the first Vcc landing pad 156 is configured to couple the drain of PU-1 to the Vcc line. The second Vcc landing pad 158 is configured to couple the drain of PU-2 to the Vcc line. The first WL-A landing pad 160 is configured to couple the gate of PG-1 to the first word line (WL-A). The second WL-A landing pad 162 is configured to couple the gate of PG-3 to the first word line (WL-A). The first WL_B landing pad 164 is configured to couple the gate of PG-2 to the second word line (WL-B). The second WL-B landing pad 166 is configured to couple the gate of PG-4 to the second word line (WL-B). The A-BL landing pad 168 is configured to couple the drain of PG-1 to the first bit line (A-BL). The B-BL landing pad 170 is configured to couple the drain of PG-2 to the second bit line (B-BL). The A-BL-bar landing pad 172 is configured to couple the drain of PG3 to the first bit line bar (A-BL-bar). The B-BL bar landing pad 174 is configured to couple the drain of PG-4 to the second bit line bar (B-BL-bar). In one embodiment, the first interconnect layer is formed in the first interconnect metal layer (referred to M1). All above interconnect features are within the cell 110, therefore referred to as intra-cell interconnect.

For cross-coupling between the two inverters, the second gate 138 is further electrically connected to the drain node 148 (first data node). The first gate 136 is further electrically connected to the drain node 150 (second data node). In one embodiment, this routing can be achieved by an intra-cell routing through M1. In another embodiment, the above interconnect between a drain node to a gate can be achieved by a local interconnect (LI) technology. In one embodiment, the local interconnect is formed using the gate electrode material, such as polysilicon. In this situation, the polysilicon is used not only to form gate electrode but also to form interconnect. More particularly, the gate electrode is extended to the targeted drain region and directly lands on the silicon substrate within the targeted drain region. Alternatively, if the gate electrode is a metal gate, then the metal gate is extended to form the local interconnect. The LI features and gates are formed during a same processing procedure.

In another embodiment, the first interconnect layer is alternatively formed using LI technology for manufacturing efficiency and packing efficiency. In this case, the first and second interconnect features 148 and 150 are formed using the LI technology. In furtherance of the embodiment, the first gate 136 is extended to directly land on the drain node 150, such as the drain of PU-2. Similarly, the second gate 138 is extended to directly land on the drain node 148, such as the drain of PU-1. Furthermore, the Vss connections (152 and 154) and various landing pads (156, 158, ..., 172 and 174) are formed by the local interconnect as well, in one embodiment. Other proper local interconnect technology may be utilized for the above routing.

Figure 4:
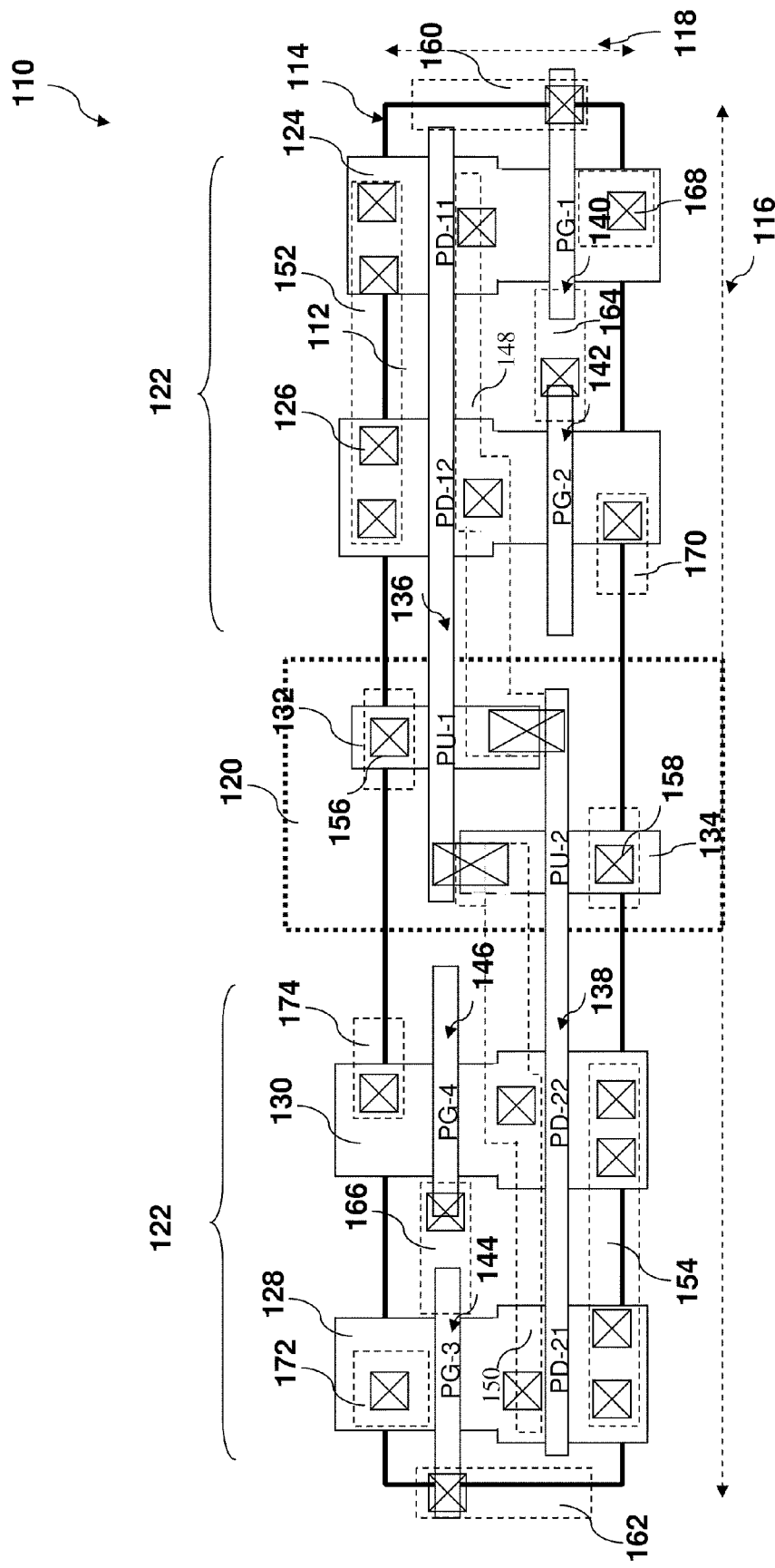

Referring to FIG. 4, the DP SRAM cell 110 further includes various contacts (marked as  but not labeled respectively for simplicity) on gates, drain nodes, Vss connection, and various landing pads. The landing pads include the first Vcc landing pad 156, the second Vcc landing pad 158, the first WL-A landing pad 160, the second WL-A landing pad 162, the first WL-B landing pad 164, the second WL-B landing pad 166, the A-BL landing pad 168, the B-BL landing pad 170, the A-BL bar landing pad 172, and the B-BL bar landing pad 174.

Figure 5:
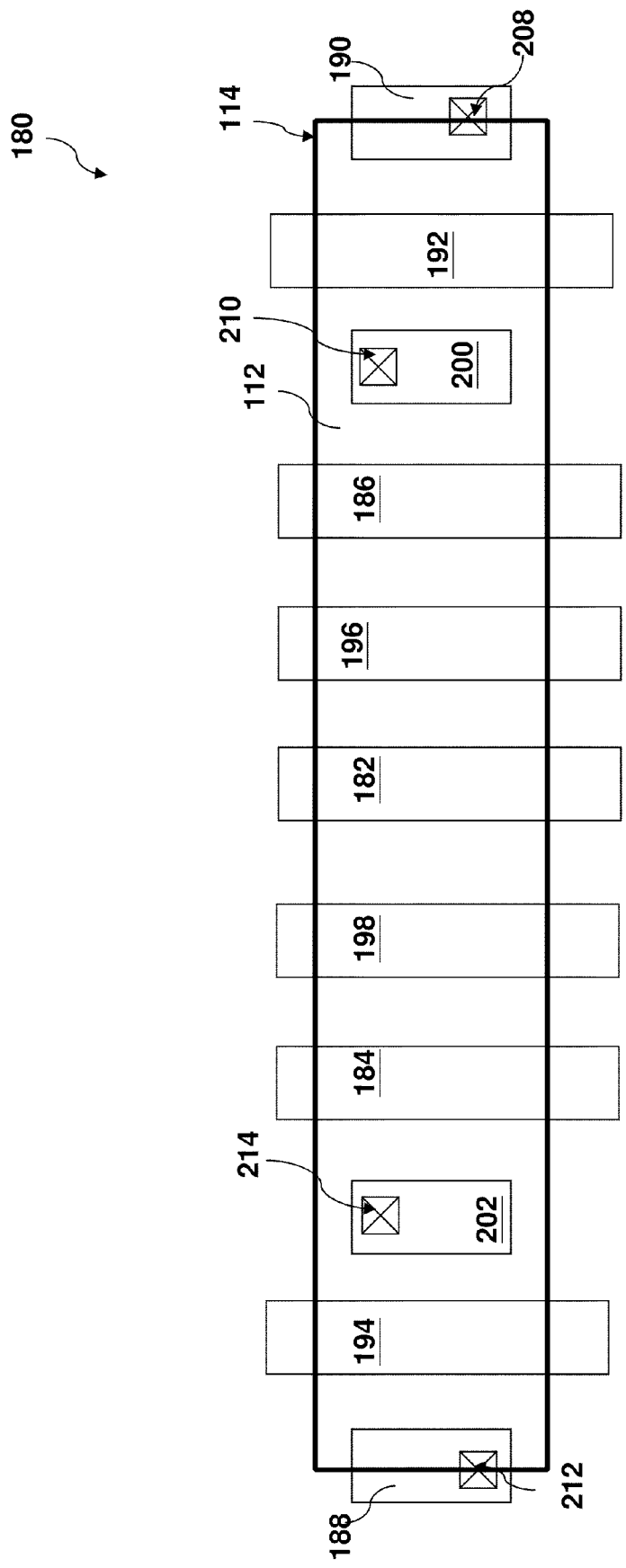
FIGS. 5 through 6 are top views of a portion of a DP SRAM device constructed according to various aspects of the present disclosure in various embodiments.
Figure 6:
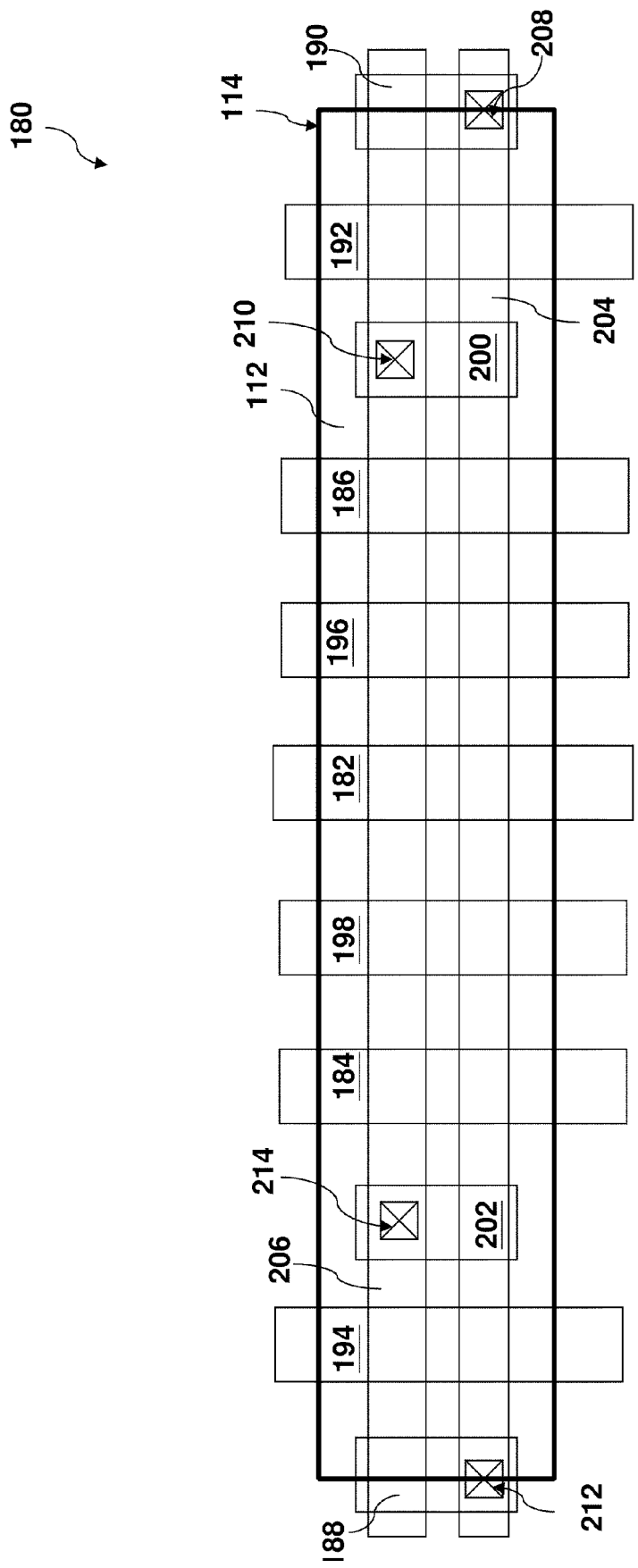

FIGS. 5 and 6 are top views of the DP SRAM cell 110 constructed according to various aspects of the present disclosure in one embodiment. More particularly, various interconnect structures 180 in the DP SRAM cell 110 are constructed and presented in FIGS. 5 and 6. In one embodiment, the DP SRAM cell 110 includes at least three interconnect layers (i.e. metal layers). The first interconnect layer is described with reference to FIG. 3. The contacts are described with reference to FIG. 4. The interconnect portion 180 of the DP SRAM cell 110 includes a second interconnect layer (referred to as second metal layer or M2) disposed over the first metal layer, and a third interconnect layer (referred to as third metal layer or M3) disposed over the second metal layer. The previously described elements of the DP SRAM cell 110 are eliminated from FIGS. 5 and 6 for simplicity. Referring to FIG. 5, the second metal layer includes various metal lines substantially aligned in the second direction of the DP SRAM cell. In one embodiment, the second metal layer includes a power line (Vcc line) 182. The Vcc line 182 is electrically connected to the Vcc landing pads through the respective contacts. The Vcc line 182 is substantially positioned in the center portion of the cell 112 in the first dimension of the cell. The second metal layer also includes complementary power lines, such as first Vss line 184 and the second Vss line 186 positioned at both sides of the Vcc line 182. The first and second Vss lines (184 and 186) are electrically connected to the first and second Vss connects (152 and 154 of FIG. 4), respectively.

The second metal layer includes a first word lines (WL-A) 188 and 190 positioned on the border of the cell, respectively. The first word lines 188 and 190 are electrically connected to the first and second word line landing pads 160 and 162 of FIG. 4 by way of respective contacts. The second metal layer includes a first bit line (A-BL) 192 and a first bit line bar (A-BL-bar) 194 electrically connected to the first bit line landing pad 168 of FIG. 4 and the first bit line bar landing pad 172 of FIG. 4, respectively, by way of respective contacts. The second metal layer includes a second bit line (B-BL) 196 and a second bit line bar (A-BL-bar) 198 electrically connected to the second bit line landing pad 170 of FIG. 4 and the second bit line bar landing pad 174 of FIG. 4, respectively, by way of respective contacts. The second metal layer further includes second word lines (WL-B) 200 and 202, electrically connected to the second word line (WL-B) landing pads 164 and 166 of FIG. 4, respectively, by way of respective contacts. In various embodiments, the metal lines in the second metal layer have different configurations. In an alternative embodiment, the first bit line bar 194 and the second bit line bar 198 switch the locations. In this case, the third active region 128 and the fourth active region 130 switch the locations as well for proper routing and configuration. The NMOSFETs PD-21 and PG-3 in the third active region and the NMOsFETs PD-22 and PG-4 in the fourth active region are repositioned with the associated active regions such that third active region still includes PD-21 and PG-3, and the fourth active region includes PD-22 and PG-4.

Still referring to FIG. 5, various vias for coupling the second metal layer to the third metal layer are properly configured and formed on the second metal layer. In one embodiment, the vias on the second metal layer include a first via 208 landing on the first word line 190 of the second metal layer, a second via 210 landing on the second word line 200 of the second metal layer, a third via 212 landing on the first word line 188 of the second metal layer, and a fourth via 214 landing on the second word line 202 of the second metal layer.

Referring to FIG. 6, the interconnect structure 180 of the DP SRAM cell 110 includes various metal lines in the third metal layer for word line routing. The metal lines in the third metal layer are substantially aligned along the first direction of the cell 112. The third metal layer includes a first word line (WL-A) 204 and a second word line (WL-B) 206. The first word line 204 is electrically connected to the gate of PG-1 through the first via 208 and to the gate of PG-3 through the third via 212. The second word line 206 is electrically connected to the gate of PG-2 through the third via 210 and to the gate of PG-4 through the fourth via 214.

Figure 7:
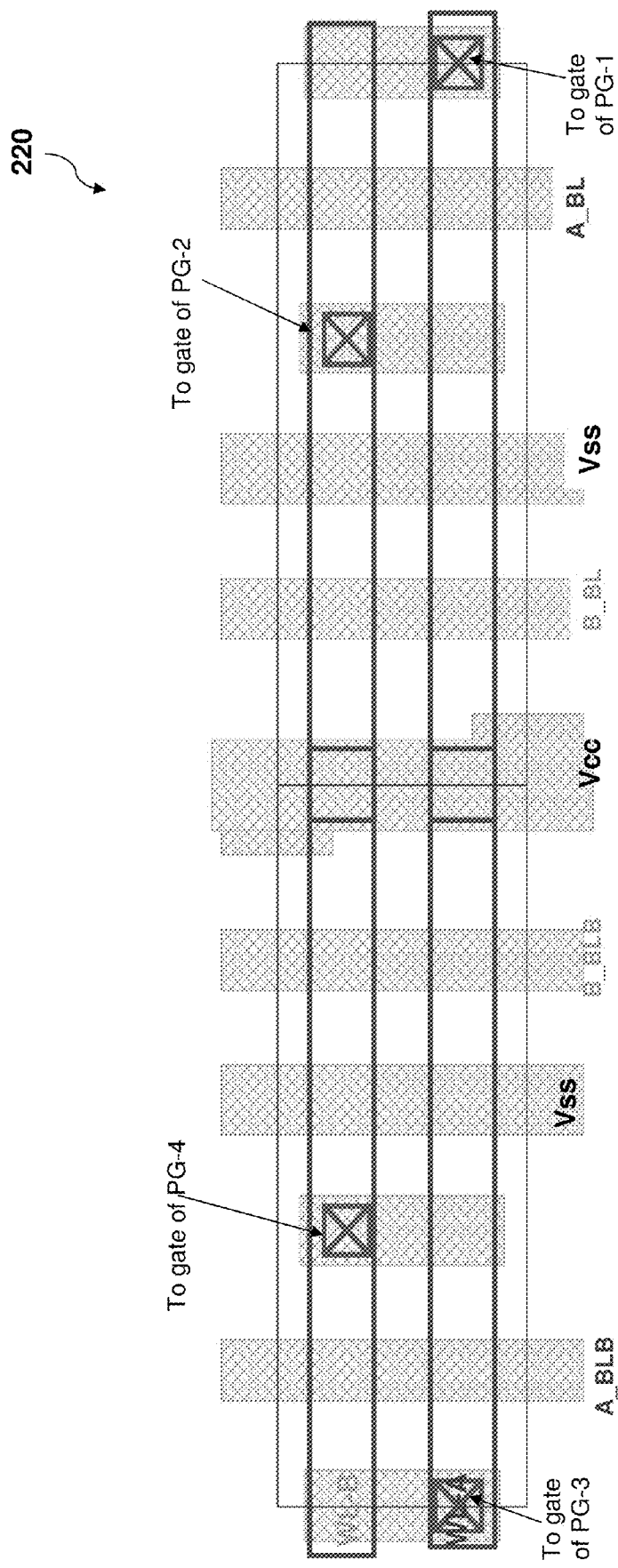
FIGS. 7 through 13 are top views of a DP SRAM device or a portion thereof constructed according to various aspects of the present disclosure in various embodiments.
Figure 8:
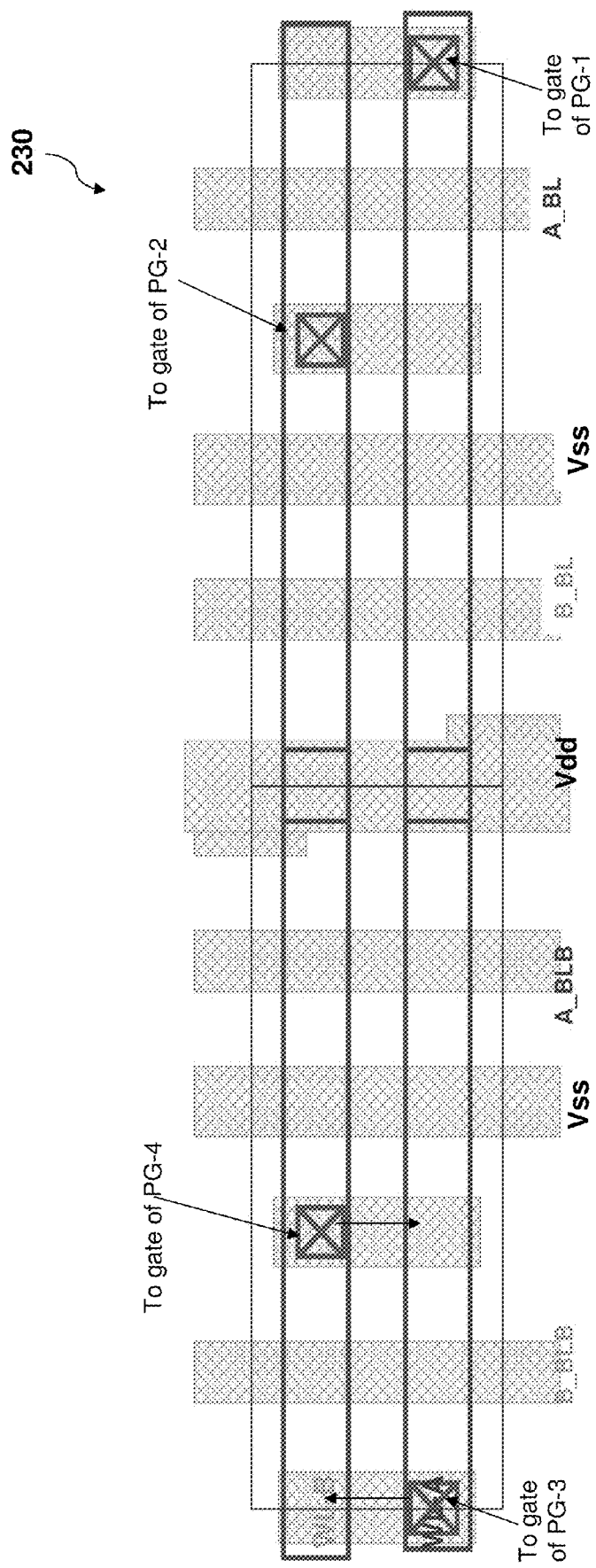

FIG. 7 is another embodiment of the second and third metal layers 220 of the DP SRAM cell 110, similar to the metal layers 180 of FIG. 6. FIG. 8 is another embodiment of the second and third metal layers 230 of the DP SRAM cell 110, similar to the metal layers 180 of FIG. 6 but the first bit line bar and second bit bar of the second metal layer switch the locations.

Figure 9:
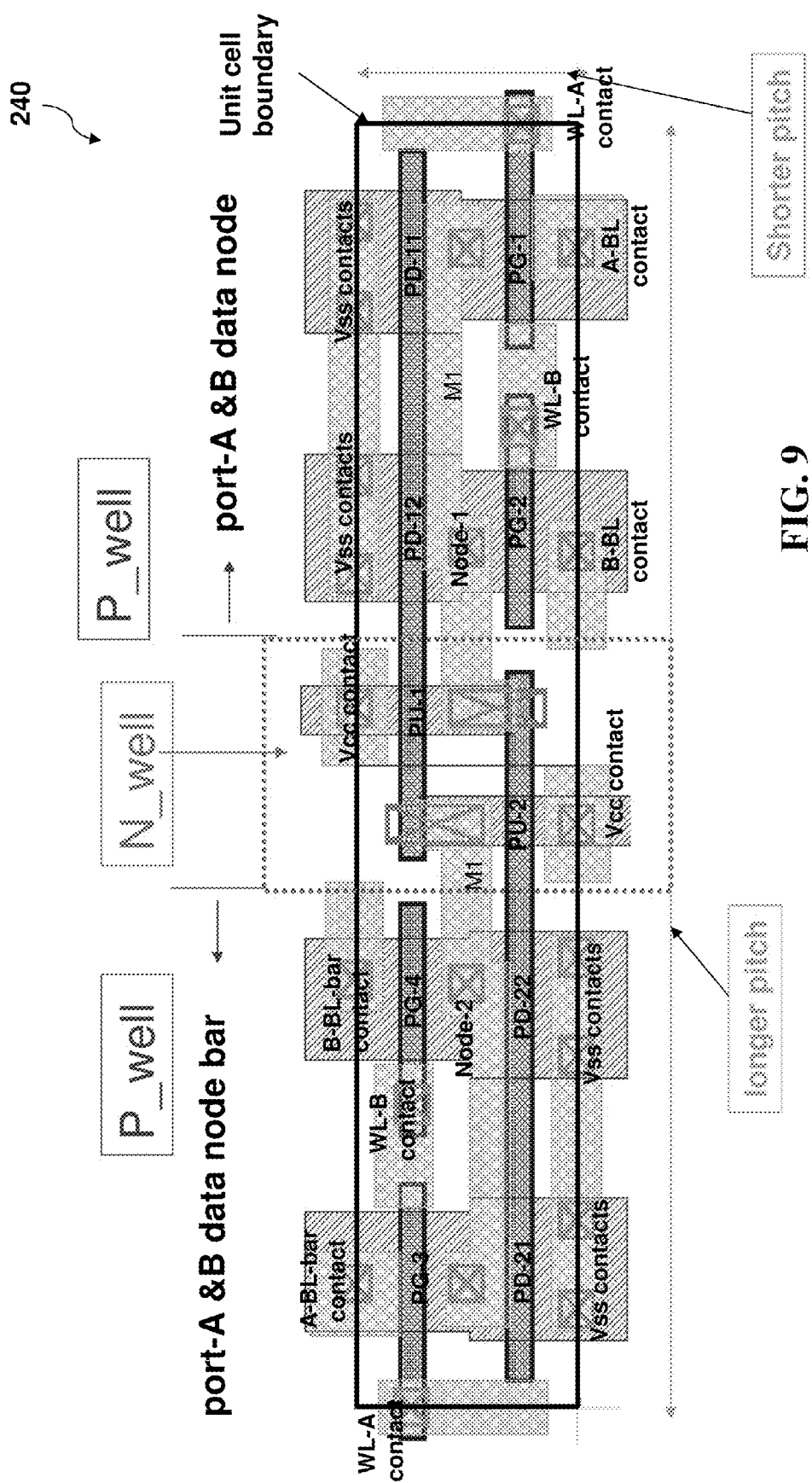
Figure 10:
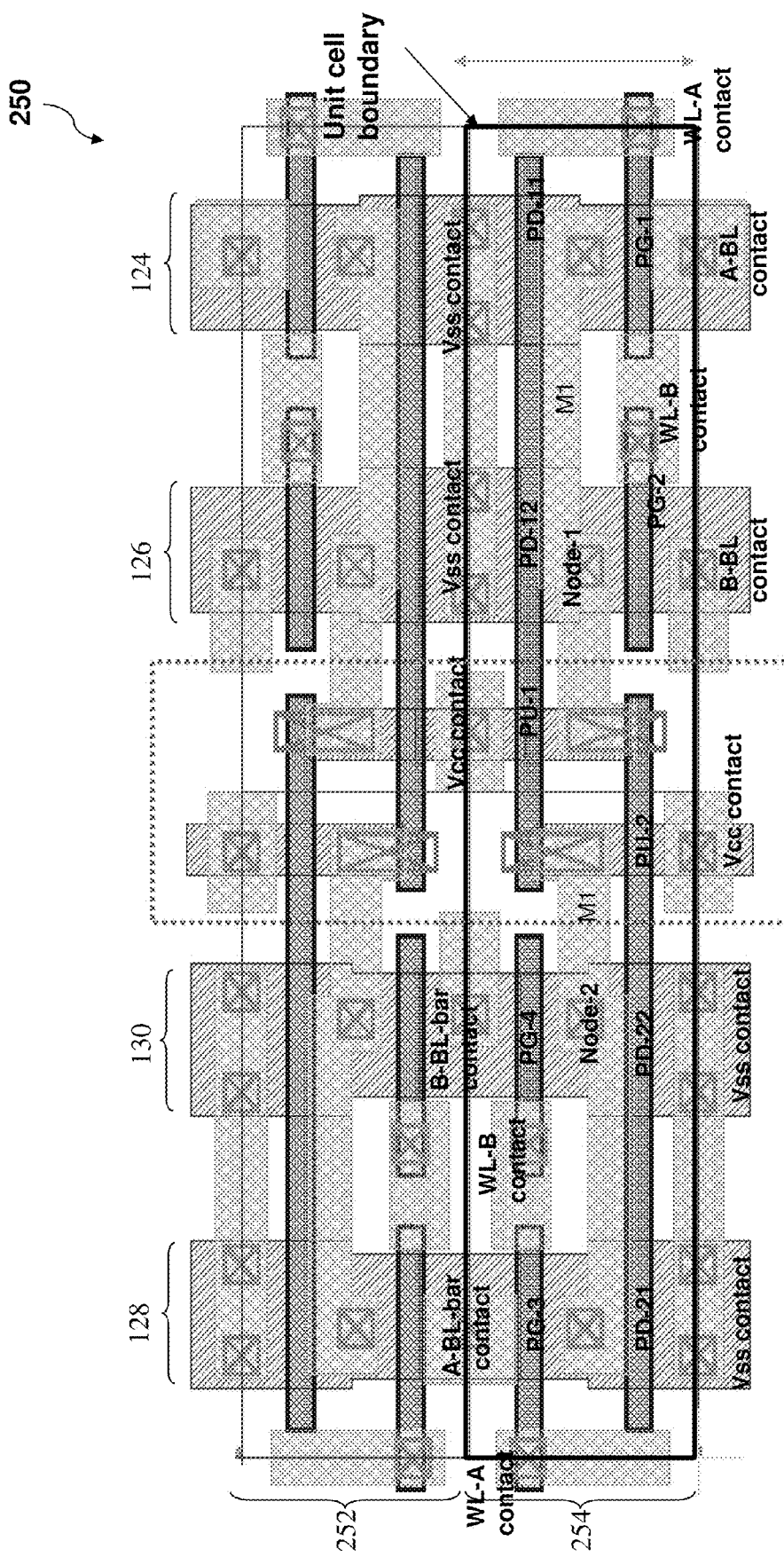

FIG. 9 is another embodiment of a top view of a DP SRAM device 240. The DP SRAM device 240 includes one DP SRAM cell 100 and is configured similarly to the DP SRAM cell 110 of FIG. 4. FIG. 10 is another embodiment of a top view of a DP SRAM device 250. The DP SRAM device 250 includes two DP SRAM cells and each cell is similar to the cell 240 of FIG. 9. Specifically, the DP SRAM device 250 includes a first DP SRAM cell 252 and a second DP SRAM cell 254. The first, second, third and fourth active regions (124, 126, 128 and 130) are continuous active regions disposed over the first cell 252 and the second cell 254. Alternatively, a plurality of (more than two) DP SRAM cells can be configured similarly such that the plurality of DP SRAM cells share continuous active regions 124, 126, 128 and 130. For example, the DP SRAM device 250 of the two cells is repeated over the first through the fourth continuous active regions.

Figure 11:
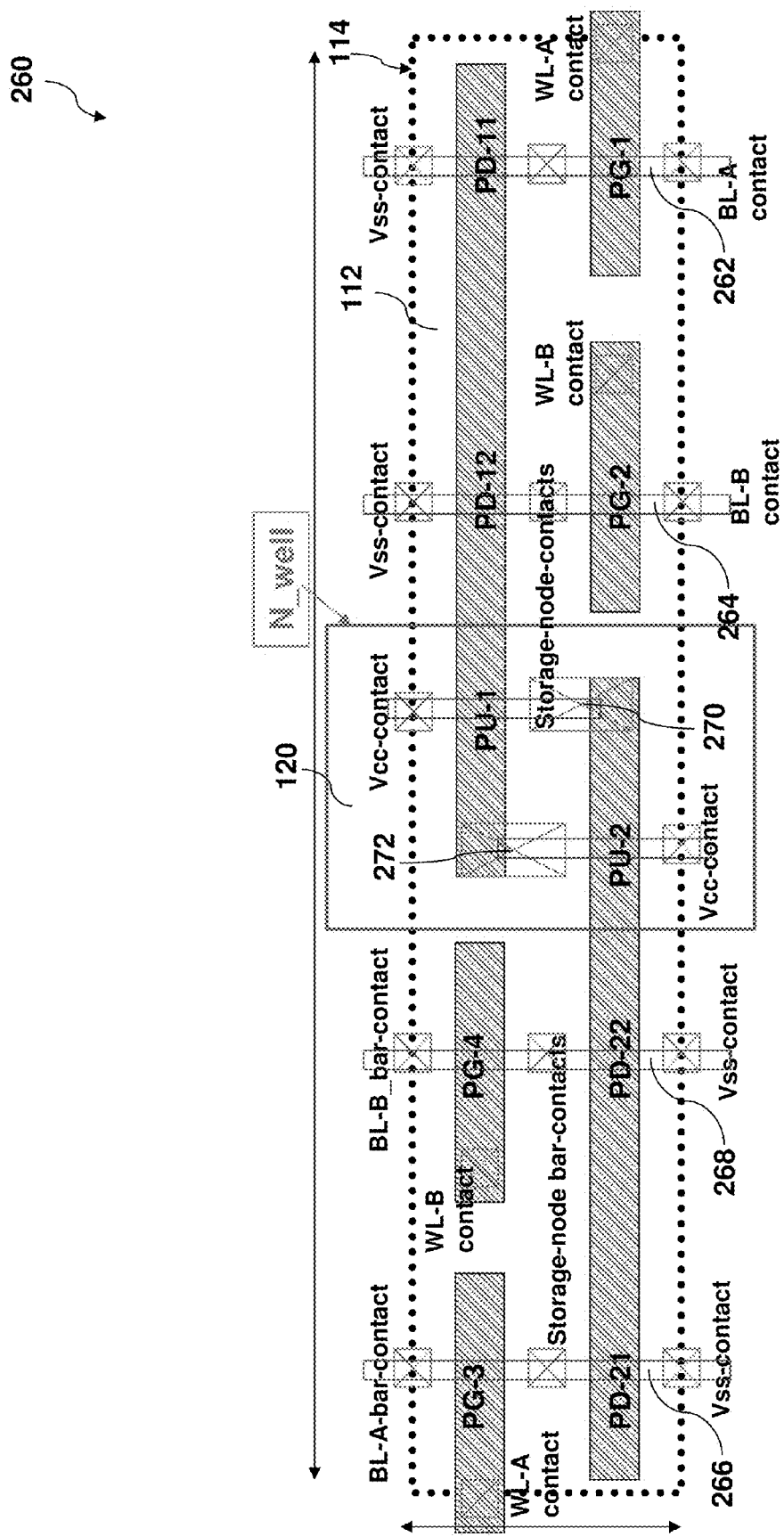

FIG. 11 illustrates another embodiment of a DP SRAM device 260 in a top view constructed according to various aspects of the present disclosure. The DP SRAM device 260 utilizes a finFET structure in which field effect transistors are formed in three dimensional geometry. In a finFET structure, a field effect transistor is formed in a protruding semiconductor (such as silicon) ridge, referred to as a fin-like structure or a fin-like active region. The gate is formed over the fin-like structure on various surfaces including the top surface, two sidewall surfaces. The channel is defined in the fin-like structure underlying aligned with gate. The source and drain are formed in the fin-like structure and are interposed by the gate. The corresponding transistor is therefore referred to as fin-FET. The DP SRAM device 260 includes one SRAM cell and is substantially similar to the DP SRAM device 110 of FIG. 4 except for the various active regions are replaced by fin-like structures. Some features of the DP SRAM device 260 are not drawn in FIG. 11 for simplicity. In this example, the first active region 124 is replaced by the first fin-like structure 262 where PD-11 and PG-1 are formed. The second active region 126 is replaced by the second fin-like structure 264 where PD-12 and PG-2 are formed. The third active region 128 is replaced by the third fin-like structure 266 where PD-21 and PG-3 are formed. The fourth active region 130 is replaced by the third fin-like structure 268 where PD-22 and PG-4 are formed. The first through fourth fin-like structures are formed the P-well region. The fifth active region 132 is replaced by the fifth fin-like structure 270 where PU-1 is formed. The sixth active region 134 is replaced by the sixth fin-like structure 272 where PU-2 is formed. The fifth and sixth fin-like structures are formed in the N-well region. Various fin-like structures are aligned in the second direction. In one embodiment, the first through fourth fin-like structures include varying width such that the first portion for the corresponding pull-down transistor is wider than the second portion for the corresponding pass-gate transistor. In one example, the width of the first portion is about 1.25 times the width of the second portion. Similarly, multiple DP SRAM cells may be formed over the continuous first through fourth fin-like structures.

Figure 12:
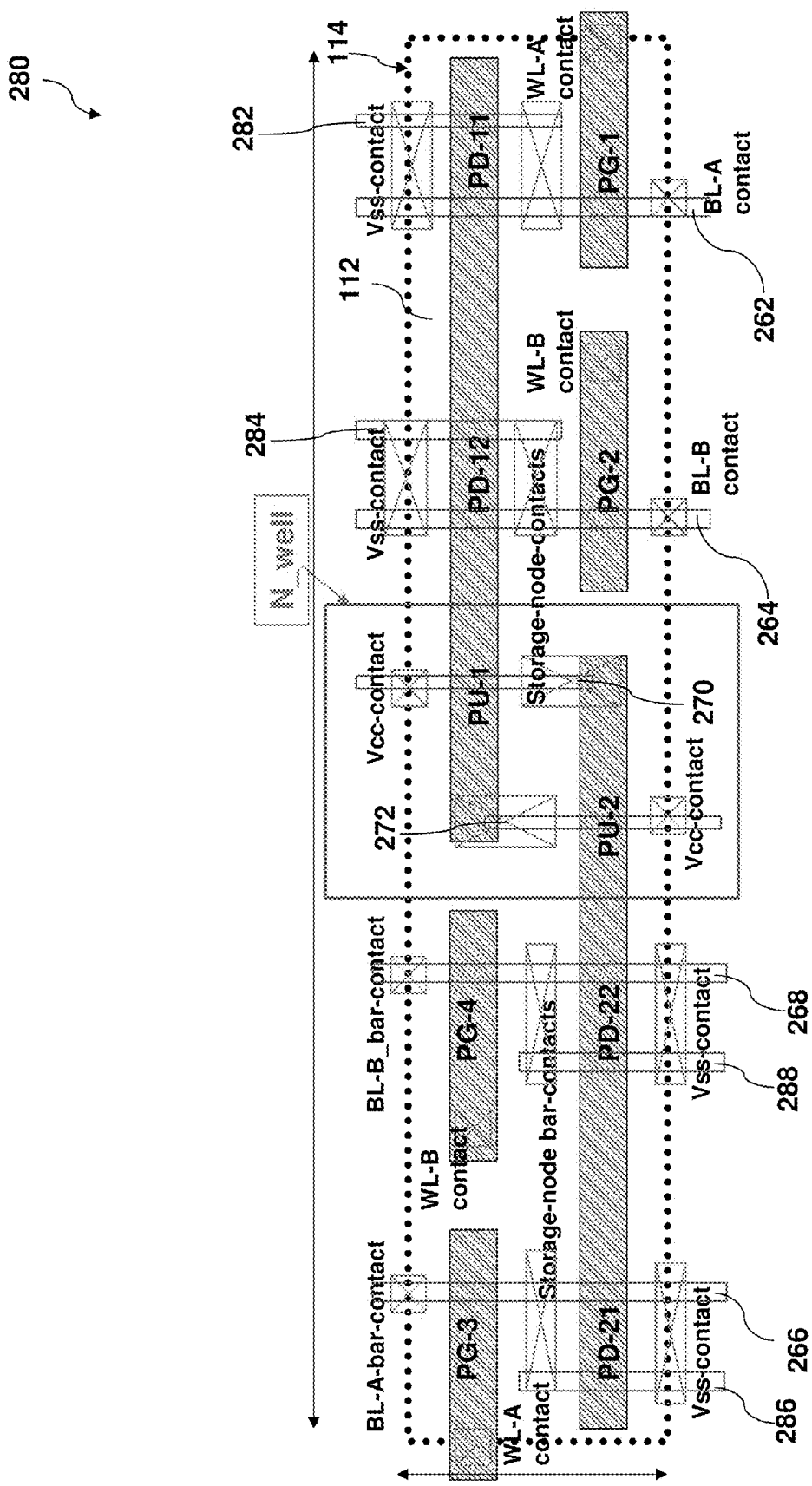

FIG. 12 illustrates another embodiment of a DP SRAM device 280 in a top view constructed according to various aspects of the present disclosure. The DP SRAM device 280 utilizes the finFET structure. The DP SRAM device 280 includes one SRAM cell and is substantially similar to the DP SRAM device 260 of FIG. 11 except for the first through fourth active regions each is replaced by more than one fin-like structures. Some features of the DP SRAM device 280 are not shown in FIG. 12 for simplicity. In furtherance of the embodiment, the number of the pull-down transistors may be different from and greater than the number of the pass-gate transistors. In one embodiment, each active region includes two fin-like structures. One is designed to form one pull-down transistor and a pass-gate transistor. The another one is designed to form only one pull-down transistor. In this example, the first active region 124 is replaced by the first fin-like structure 262 and a first short fin-like structure 282. PD-11 is formed over the fin-like structures 262 and 282 while PG-1 is formed on the fin-like structure 282. Specifically, the gate of PD-11 is formed over the first fin-like structure and the short fin-like structure 282. In this way, the effective width of PD-11 is greater than the effective width of PG-1. Similarly, the second region 126 is replaced by the second fin-like structure 264 and a second short fin-like structure 284. PD-12 is formed over the fin-like structures 264 and 284 while PG-2 is formed only on the short fin-like structure 284. The third region 128 is replaced by the third fin-like structure 266 and a third short fin-like structure 286. PD-21 is formed over the fin-like structures 266 and 286 while PG-3 is formed only on the short fin-like structure 286. The fourth region 130 is replaced by the fourth fin-like structure 268 and a fourth short fin-like structure 288. PD-22 is formed over the fin-like structures 268 and 288 while PG-4 is formed only on the short fin-like structure 284. The first through fourth fin-like structures are formed the P-well region. The fifth active region 132 is replaced by the fifth fin-like structure 270 where PU-1 is formed. The sixth active region 134 is replaced by the sixth fin-like structure 272 where PU-2 is formed. The fifth and sixth fin-like structures are formed in the N-well region. Various fin-like structures are aligned in the second direction.

Figure 13:
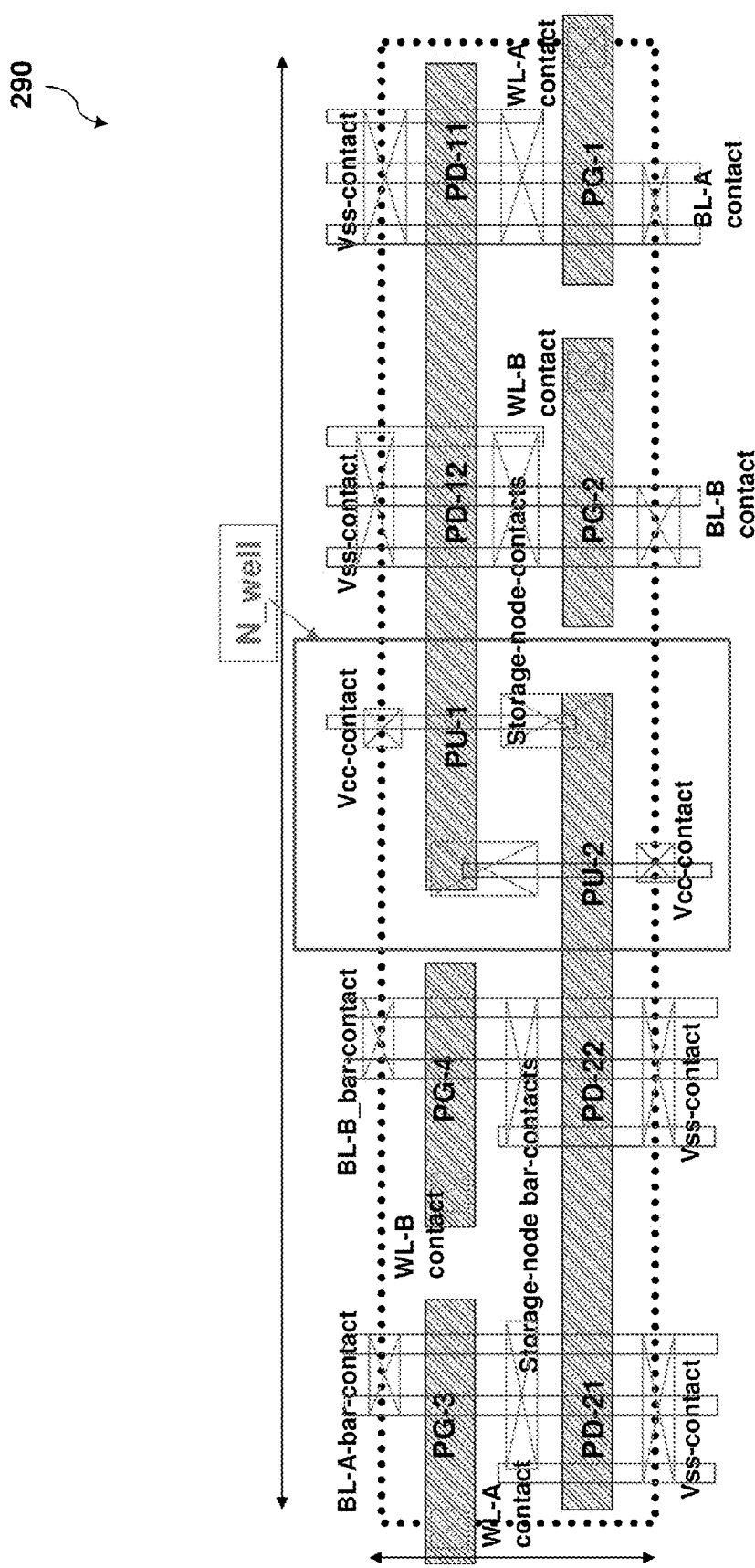

FIG. 13 illustrates another embodiment of a DP SRAM device 290 in a top view constructed according to various aspects of the present disclosure. The DP SRAM device 290 utilizes the finFET structure. The DP SRAM device 290 includes one SRAM cell and is substantially similar to the DP SRAM device 280 of FIG. 12 except for the first through fourth active regions each includes additional long fin-like structure. Some features of the DP SRAM device 290 are not shown in FIG. 13 for simplicity. In furtherance of the embodiment, each active region includes two long fin-like structures and one short fin-like structure. the pull-down transistor is formed on the two long and one short fin-like structure while the pass-gate transistor is only formed on the two long fin-like structures.

In various embodiment, the disclosed DP SRAM device addresses various issues noted in the background. In one example, In processing development of each new generation, the single-port SRAM devices are usually used as the test vehicle for processing/yield/Vcc minimization/reliability development. The disclosed DP SRAM structure achieves a similar device configuration and routing to that of the single port cell. This provides single-port SRAM fully tracking cell performance and behavior, reducing the development effort, cost, cycle and risk on the DP SRAM cells.

The present disclosure provides a dual-port SRAM cell structure and a layout with twin MOSFETs (physically isolated two transistors) for a pull down device to address the above problems. The layout of the active region is straight-like pattern on both pull-down and pass-gate devices. The disclosed structure and layout are also good for high-k/metal-gate and finFET structure in various examples. One or more other advantages may present in various embodiments. In one example, the disclosed DP SRAM device provides at least 20% Icell increase compared with the existing structure and layout. It also achieves a beta ratio and static noise margin (SNM) performance similar to the single port SRAM device. In another example, The disclosed DP SRAM device provides straight active regions, eliminating L-shape and T-shape induced N-node junction leakage issue and therefore leading to improved cell stability. In another example, each half port pull-down devices and pass-gate devices are formed at a same active region. One cell totally has at least four active regions each having cascaded pass-gate/pull-down devices, minimizing the device asymmetry between pass-gate devices and pull-down devices. The disclosed DP SRAM devices also divides each pull-down device to provide twin pull-down devices (such as from PD-11 and PD-12) to reduce the current crowding effect. In another example, the disclosed DP SRAM provides continuous active regions extending to multiple cells (4 or more) such that the pull-down devices and pass-gate devices are formed thereon, solving length of diffusion (LOD) effect. It provides fully balanced cells and helps on device matching performance. In another embodiment, the disclosed SRAM device provides even resistance among the two ports. For example, the cell current through the first bit line and the current through the second bit line are substantially similar due to the similar paths.

Other embodiments of the disclosed DP SRAM cell may present. FIGS. 12 and 13 provide various embodiments of the DP SRAM devices using the finFET technology and each half port has more than one pull-down devices and at least one pass-gate devices. Furthermore, in each half port, the number of the pull-down devices is equal to or greater than the number of the pass-gate. The same layout can be applied to both fin-like NMOSFETs and the conventional NMOSFETs. In one embodiment, each DP SRAM cell can have 4 to 64 pull-down devices. Each DP SRAM cell can have 4-64 pass-gate devices. Each cascaded NMOSFETs have up to 32 transistors. Particularly, each cascaded NMOSFETs have multiple fin-like active regions, up to 32 fin-like active regions.

Thus, the present disclosure provides a dual port static random access memory (SRAM) cell. The dual-port SRAM cell includes four sets of cascaded n-type metal-oxide-semiconductor field-effect transistors (NMOSFETs), each set of cascaded NMOSFETs having a pull-down device and a pass-gate device; and a first and second pull-up devices (PU1 and PU2) configured with the four pull-down devices to form two cross-coupled inverters, wherein two of the pass-gate devices are configured to form a first port and another two of the pass-gate devices are configured to form a second port.

The present disclosure also provides another embodiment of a dual port SRAM cell. The cell includes a first inverter having a first pull-up transistor and a first group of at least two pull-down transistors; a second inverter having a second pull-up transistors and a second group of at least two pull-down transistors, the second inverter is cross-coupled with the first inverter; a first group of at least two pass-gate transistors coupled with the first and second inverters to form a first port; and a second group of at least two pass-gate transistors coupled with the first and second inverters to form a second port, wherein each of the pull-down transistors and the pass-gate transistors includes a n-type metal-oxide-semiconductor field-effect transistor (NMOSFET) and each of the pull-up transistors includes a p-type metal-oxide-semiconductor field-effect transistor (PMOSFET).

The present disclosure also provides another embodiment of a dual port SRAM cell. The cell includes a first, second, third and fourth active regions formed in a substrate; a first pull-down transistor and a first pass-gate transistor formed in the first active region; a second pull-down transistor and a second pass-gate transistor formed in the second active region; a third pull-down transistor and a third pass-gate transistor formed in the third active region; a fourth pull-down transistor and a fourth pass-gate transistor formed in the fourth active region; a first pull-up transistor, and the first and second pull-down transistors configured to form a first inverter; and a second pull-up transistor, and the third and fourth pull-down transistors configured to form a second inverter. The second inverter is cross-coupled with the first inverter; the first and third pass-gate transistors coupled with the first and second inverters to form a first port; and the third and fourth pass-gate transistors coupled with the first and second inverters to form a second port.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A static random access memory (SRAM) cell comprising:
   four sets of cascaded metal-oxide-semiconductor field-effect transistors (MOSFETs), each set of cascaded MOSFETs having a pull-down device and a pass-gate device disposed within a continuous active region; and
   first and second pull-up devices (PU1 and PU2) configured with the four pull-down devices to form two cross-coupled inverters,
   wherein two of the pass-gate devices are configured to form a first port and another two of the pass-gate devices are configured to form a second port.

2. The SRAM cell of claim 1, wherein the four sets of cascaded MOSFETs includes:
   a first set of cascaded n-type MOSFETs (NMOSFETs) having a first pass-gate device (PG1) and a first pull-down device (PD11) both disposed in a first continuous active region;
   a second set of cascaded MOSFETs having a second pass-gate device (PG2) and a second pull-down device (PD12) both disposed in a second continuous active region;
   a third set of cascaded NMOSFETs having a third pass-gate device (PG3) and a third pull-down device (PD21) both disposed in a third continuous active region; and
   a fourth set of cascaded NMOSFETs having a fourth pass-gate device (PG4) and a fourth pull-down device (PD22) both disposed in a fourth continuous active region.

3. The SRAM cell of claim 2, wherein the two pull-up devices are disposed in a continuous n-well isolated from the first, second, third and fourth continuous active regions.

4. The SRAM cell of claim 2, wherein the four sets of cascaded MOSFETs includes:
   a drain node of the PG1 is electrically connected to a first bit-line;
   a source node of the PG1 is electrically connected to a drain node of the PD11;
   a gate node of the PG1 is electrically connected to a first word-line;
   a source node of the PD11 is electrically connected to a first Vss-line;
   a drain node of the PG2 is electrically connected to a second bit-line;
   a source node of the PG2 is electrically connected to a drain node of the PD12;
   a gate node of the PG2 is electrically connected to a second word-line;
   a source node of the PD12 is electrically connected to the first Vss-line;
   a drain node of the PG3 is electrically connected to a first bit-line-Bar;
   a source node of the PG3 is electrically connected to a drain node of the PD21;
   a gate node of the PG3 is electrically connected to the first word-line;
   a source node of the PD21 is electrically connected to a second Vss-line;
   a drain node of the PG4 is electrically connected to a second bit-line-Bar;
   a source node of the PG4 is electrically connected to a drain node of the PD22;
   a gate node of the PG4 is electrically connected to the second word-line; and
   a source node of the PD22 is electrically connected to the second Vss-line.

5. The SRAM cell of claim 4, wherein the four sets of cascaded MOSFETs includes:
   a drain node of the PU1 and the drain nodes of the PD11 and PD12 electrically connected together, defining a data node;
   gate nodes of the PD11, PD12 and PU1 electrically connected together and coupled to a data node bar;
   a drain node of the PU2 and the drain nodes of the PD21 and PD22 electrically connected together to the data node bar;
   gate nodes of the PD21, PD22 and PU2 electrically connected together and coupled to the data node; and
   source nodes of the PU1 and PU2 are electrically connected to a Vcc-line.

6. The SRAM cell of claim 4, further comprising a silicide layer configured to connect:
   the source node of the PG1 to the drain node of the PD11;
   the source node of the PG2 to the drain node of the PD12;
   the source node of the PG3 to the drain node of the PD21; and
   the source node of the PG4 to the drain node of the PD22.

7. The SRAM cell of claim 6, wherein
   the first port (A-port) includes a first word-line, a first bit-line and a first bit-line-bar conductors;
   the first word-line is electrically connected to the gate node of the PG1 and PG3;
   the first bit-line is electrically connected to the drain node of the PG1;
   the first bit-line-bar is electrically connected to the drain node of the PG3;
   the second port (B-port) includes a second word-line, a second bit-line and a second bit-line-bar conductors;
   the second word-line is electrically connected to the gate node of the PG2 and PG4;
   the second bit-line is electrically connected to the drain node of the PG2; and
   the second bit-line-bar is electrically connected to the drain node of the PG4.

8. The SRAM cell of claim 2, further comprising:
a fifth active region, PU1 being disposed on the fifth active region; and
a sixth active region, PU2 being disposed on the sixth active region,
wherein the first through the sixth active regions are physically isolated from each other by an isolation structure.

9. The SRAM cell of claim 8, wherein the first through the sixth active regions are all aligned to a first direction and are extended at least to other three SRAM cells in the first direction.

10. The SRAM cell of claim 1, further comprising a local interconnect directly contacting active regions and configured for intra-cell local-interconnect, metal landing pad, and Vss nodes connection.

11. The SRAM cell of claim 1, wherein the pull-down devices have a channel width greater than the width of the pass-gate devices by at least 10%.

12. The SRAM cell of claim 1, further comprising:
a power line (Vdd-line) coupled to the two pull-up devices; and
a first complementary power line (first Vss-line) and a second complementary power line (second Vss-line) coupled to the pull-down devices, wherein the Vdd-line, the first Vss-line and the second Vss-line are configured in a same metal layer.

13. The SRAM cell of claim 1, further comprising:
a first metal layer providing drain node connection to the pull-down devices and the pull-up devices;
a second metal layer disposed over the first metal layer, the second metal layer including a first word-line landing pad, a first bit-line, a second word-line landing pad, a first Vss-line, a second bit-line, a Vcc-line, a second bit-line-Bar, a second Vss-line, a third word-line landing pad, a first bit-line-Bar and fourth word-line landing pad; and
a third metal layer disposed over the second metal layer, the third metal layer including a first word-line and a second word-line.

14. The SRAM cell of claim 1, wherein the four sets of cascaded MOSFETs include a fin-type n-type MOSFET (NMOSFET) structure, each set of the four sets of cascaded NMOSFETs includes at least two fin-type active regions, and each of the fin-type active regions includes a pull-down transistor.

15. The SRAM of claim 14, wherein each set of the four sets of cascaded NMOSFETs includes a number of pull-down transistors up to 16 and a number of pass-gate transistors up to 16.

16. The SRAM of claim 14, wherein the each of the fin-type active regions includes at least one pull-down transistor and one pass-gate transistor.

17. The SRAM of claim 14, wherein each of the fin-type NMOSFET structure includes at least 2 pull-up transistors formed on multiple fin-type active regions.

18. The SRAM of claim 14, wherein one of the fin-type active regions further includes a pass-gate transistor cascaded with the pull-down transistor, the total fin-transistor ratio of the pull-down transistor to the pass-gate transistor is equal to or greater than 1.25.

19. A dual port static random access memory (SRAM) cell comprising:
a first inverter having a first pull-up transistor (PU1) and a first group of at least two pull-down transistors;
a second inverter having a second pull-up transistor (PU2) and a second group of at least two pull-down transistors, the second inverter being cross-coupled with the first inverter;
a first group of at least two pass-gate transistors coupled with the first and second inverters to form a first port; and
a second group of at least two pass-gate transistors coupled with the first and second inverters to form a second port,
wherein each of the pull-down (PD) transistors and the pass-gate (PG) transistors includes a n-type metal-oxide-semiconductor field-effect transistor (NMOSFET) and each of the pull-up transistors includes a p-type MOSFET (PMOSFET), and
wherein at least one of the at least two pull-down transistors of the first group and at least one of the at least two pass-gate transistors of the first group are disposed within a continuous fin-type active region.

20. The SRAM cell of claim 19, wherein the NMOSFETs comprises:
a first cascaded NMOSFETs that includes PG1 and PD11 formed on a first continuous active region, a drain node of the PG1 is electrically connected to a first bit-line, a source node of the PG1 is electrically connected to a drain node of the PD11, a gate node of the PG1 is electrically connected to a first word-line, a source node of the PD11 is electrically connected to a first Vss-line;
a second cascaded NMOSFETs that includes PG2 and PD12 formed on a second continuous active region, a drain node of the PG2 is electrically connected to a second bit-line, a source node of the PG2 is electrically connected to a drain node of the PD12, a gate node of the PG2 is electrically connected to a second word-line, a source node of the PD12 is electrically connected to the first Vss-line;
a third cascaded NMOSFETs that includes PG3 and PD21 formed on a third continuous active region, a drain node of the PG3 is electrically connected to a first bit-line-Bar, a source node of the PG3 is electrically connected to a drain node of the PD21, a gate node of the PG3 is electrically connected to the first word-line, a source node of the PD21 is electrically connected to a second Vss-line; and
a fourth cascaded NMOSFETs that includes PG4 and PD22 formed on a fourth continuous active region, a drain node of the PG4 is electrically connected to a second bit-line-Bar, a source node of the PG4 is electrically connected to a drain node of the PD22, a gate node of the PG4 is electrically connected to the second word-line, a source node of the PD22 is electrically connected to the second Vss-line.

21. The SRAM cell of claim 20, wherein
the drain nodes of the PD11, PD12 and the first pull-up transistor (PU1) are electrically connected together to a data node;
the gate nodes of the PD11, PD12 and the second pull-up transistor (PU2) are electrically connected together to a data node bar;
the drain nodes of the PD21, PD22 and PU2 are electrically connected together to the data node bar;
the gate nodes of the PD21, PD22 and PU2 are electrically connected together to the data node; and
the source nodes of the PU1 and PU2 are electrically connected to a Vcc-line.

22. A dual port static random access memory (SRAM) device comprising:
a first, second, third and fourth continuous active regions formed in a substrate;

a first pull-down transistor and a first pass-gate transistor formed in the first continuous active region;
a second pull-down transistor and a second pass-gate transistor formed in the second continuous active region;
a third pull-down transistor and a third pass-gate transistor formed in the third continuous active region;
a fourth pull-down transistor and a fourth pass-gate transistor formed in the fourth continuous active region;
a first pull-up transistor, and the first and second pull-down transistors configured to form a first inverter; and
a second pull-up transistor, and the third and fourth pull-down transistors configured to form a second inverter,
wherein the second inverter is cross-coupled with the first inverter; the first and third pass-gate transistors coupled with the first and second inverters to form a first port; and the second and fourth pass-gate transistors coupled with the first and second inverters to form a second port.

* * * * *